United States Patent
Paton et al.

(10) Patent No.: US 6,297,107 B1
(45) Date of Patent: Oct. 2, 2001

(54) HIGH DIELECTRIC CONSTANT MATERIALS AS GATE DIELECTRICS

(75) Inventors: Eric Paton, Morgan Hill; Matthew S. Byunoski, Palo Alto, both of CA (US); Paul R. Besser, Austin, TX (US); Paul L. King, Mountain View; Qi Xiang, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/691,228

(22) Filed: Oct. 19, 2000

(51) Int. Cl.[7] ............... H01L 21/336; H01L 21/3205; H01L 21/302

(52) U.S. Cl. ............ 438/291; 438/197; 438/692; 438/585; 438/595

(58) Field of Search .................. 438/197, 592, 438/585, 287, 291, 735; 257/408, 330, 751, 902

(56) References Cited

U.S. PATENT DOCUMENTS

| | | | |
|---|---|---|---|
| 4,851,895 | * | 7/1989 | Green et al. ............... 357/67 |
| 5,356,833 | * | 10/1994 | Maniar et al. ............ 437/187 |
| 5,405,805 | * | 4/1995 | Homma .................... 437/195 |
| 5,960,270 | | 9/1999 | Misra et al. . |
| 6,048,790 | | 4/2000 | Iacoponi et al. . |
| 6,051,470 | | 4/2000 | An et al. . |
| 6,057,583 | * | 5/2000 | Gardner et al. ........... 257/408 |
| 6,107,667 | | 8/2000 | An et al. . |
| 6,140,167 | * | 10/2000 | Gardner et al. ........... 438/197 |
| 6,200,865 | * | 3/2001 | Gardner et al. ........... 438/291 |
| 6,203,613 | * | 3/2001 | Gates et al. .............. 117/104 |

OTHER PUBLICATIONS

"Metalorganic Deposition (MOD): a Nonvacuum, Spin-on, Liquid-based, Thin Film Method" by Mantese et al., MRS Bulletin (Oct. 1989), pp. 48–53.

* cited by examiner

Primary Examiner—Michael Lebentritt

(57) ABSTRACT

A semiconductor structure having a gate dielectric between a gate electrode and a semiconductor substrate is formed with a high dielectric metal oxide layer by replacing a sacrificial gate oxide. Embodiments include forming the metal oxide layer by applying a chemical solution deposition of a metalorganic on to an exposed surface of the substrate followed by pyrolizing the metalorganic residue to a metal oxide.

13 Claims, 4 Drawing Sheets

HIGH DIELECTRIC CONSTANT MATERIALS AS GATE DIELECTRICS

RELATED APPLICATIONS

This application contains subject matter related to subject matter disclosed in copending U.S. patent application Ser. No. 09/375,503, filed on Aug. 19, 1999, entitled MOS TRANSISTOR FORMATION, now U.S. Pat. No. 6,184,114; and U.S. patent application Ser. No. 09/732,892, filed Dec. 11, 2000, entitled SELECTIVE CHEMICAL VAPOR DEPOSITION OF HIGH DIELECTRIC CONSTANT MATERIALS AS GATE DIELECTRICS.

FIELD OF THE INVENTION

The present invention relates to a method of manufacturing high-density integrated semiconductor devices exhibiting reliable, adherent, high dielectric constant materials for active devices such as MOS transistors formed on a semiconductor substrate. The invention has particular utility in manufacturing high-density integration semiconductor devices, including multi-level devices, with design rules of 0.18 micron and under.

BACKGROUND ART

Fabrication of a semiconductor device and an integrated circuit thereof begins with a semiconductor substrate and employs film formation, ion implantation, photolithographic, etching and deposition techniques to form various structural features in or on a semiconductor substrate to attain individual circuit components which are then interconnected to ultimately form an integrated semiconductor device. Escalating requirements for high densification and performance associated with ultra large-scale integration (ULSI) semiconductor devices requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

There is a demand for large-scale and ultra large-scale integration devices employing high performance metal-oxide-semiconductor (MOS) devices. MOS devices typically comprise a pair of ion implanted source/drain regions in a semiconductor substrate and a channel region separating the source/drain regions. Above the channel region is typically a thin gate oxide and a conductive gate comprising conductive polysilicon or another conductive material. In a typical integrated circuit, a plurality of MOS devices of different conductivity types, such as n-type and p-type, and complementary MOS (CMOS) devices employing both p-channel and n-channel devices are formed on a common substrate. MOS technology offers advantages of significantly reduced power density and dissipation as well as reliability, circuit performance and cost advantages.

FIG. 1 illustrates a cross-sectional portion of an exemplary CMOS structure comprising a doped semiconductor substrate 10 typically of monocrystalline silicon of a first conductivity type (p or n). The CMOS structure further comprises field oxide area 12, gate oxide layer 14, conductive gate electrodes 16 and 18, typically of polysilicon, formed over gate oxide layer 14, and stepped source and drain regions 20 and 22 which include lightly or moderately doped shallow extensions 20A and 22A. Completing the MOS transistor precursor structure are insulative sidewall spacers 24A through 24D, formed on the side surfaces of each of gate electrodes 16 and 18.

The drive towards increased miniaturization and the resultant limits of conventional gate oxide layers have served as an impetus for the development of newer, high dielectric constant materials as substitutes for conventional silicon oxide-based gate oxide layers. Since the drain current in a MOS device is inversely proportional to the gate oxide thickness, the gate oxide is typically made as thin as possible commensurate with the material's breakdown potential and reliability.

Decreasing the thickness of the gate oxide layer between the gate electrode and the source/drain extension regions together with the relatively high electric field across the gate oxide layer, can undesirably cause charge carriers to tunnel across the gate oxide layer. This renders the transistor "leaky", degrading its performance. To alleviate this problem, high-k dielectrics (dielectrics that have high dielectric constants) are used as the gate insulator.

It is further desirable that the high dielectric material adheres to the intended adjacent surfaces and has relatively smooth surfaces. Another consideration is that such dielectric materials used should preferably have a high dielectric constant, as compared to the value of 4.1 to 3.9 for a conventionally employed silicon dioxide ($SiO_2$) layer.

Hence, it would be highly advantageous to develop a process that would permit the use of optimum materials in the formation of the gate electrode structure. It would also be highly advantageous to develop methodologies capable of optimum MOS transistor formation. Accordingly, there exists a need for a method of manufacturing MOS semiconductor devices with a high dielectric gate dielectric layer that improves device performance.

SUMMARY OF THE INVENTION

An advantage of the present invention is a composite structure having a reliable, high dielectric layer between a gate electrode and a semiconductive substrate and methods of their formation.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of forming a composite structure comprising a semiconductor substrate, a high dielectric layer on the semiconductor substrate and a gate electrode on the high dielectric layer. The method comprises: forming a sacrificial gate oxide layer on a surface of a semiconductor substrate; forming a sacrificial gate electrode on the sacrificial gate oxide layer, depositing an insulating layer over the substrate and adjacent to the sacrificial gate electrode; removing the sacrificial gate electrode; removing the sacrificial gate oxide layer to expose the surface of the substrate; applying a metalorganic compound on the surface of the substrate; and forming a metal oxide layer on the surface of the substrate from the applied metalorganic compound. Advantageously, forming the metal oxide layer provides a gate dielectric having a high dielectric constant thereby improving the quality and reliability of a device fabricated from the semiconductor structure.

Embodiment of the present invention include forming the metal oxide layer by spin coating a solution containing the metalorganic compound, such as a solution containing a metal alkoxide, metal b-diketonate, metal dialkylamide, metal carboxylate, and then pyrolizing the applied metalorganic compound in an oxidizing ambience at a temperature of about 300° C. to about 900° C.

Another aspect of the present invention includes a method of forming a semiconductor device having a metal oxide layer as the gate dielectric layer. The method comprises: forming a sacrificial gate oxide layer on a semiconductor substrate; forming a first gate electrode on the sacrificial gate oxide layer; depositing an insulating on the substrate and adjacent to the first gate electrode; removing the first gate electrode; removing the sacrificial gate oxide layer to expose the substrate thereunder; forming a metal oxide layer on the exposed surface of the semiconductor substrate; and forming a second gate electrode on the metal oxide layer. Advantageously, the metal oxide layer can be formed to a thickness of about 50 Å to about 10 Å by solution chemical deposition followed by pyrolysis.

Another aspect of the present invention is a MOS device having a high dielectric gate oxide. The device comprises: a semiconductor substrate having a surface; a pair of spaced apart source and drain regions formed in the substrate and extending from the surface to a depth below the surface; a thin metal oxide layer formed on the surface of the substrate and between the source and drain regions; a gate electrode formed over and in contact with the metal oxide layer having insulative sidewall spacers formed on opposite side surfaces thereof, a dielectric layer adjacent to the insulative sidewall spacers and over the substrate. Advantageously, the present invention contemplates a metal oxide layer selected from the group consisting of group IV and group V metal oxides, such as hafnium, titanium, tantalum and zirconium oxides.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein.

DESCRIPTION OF THE INVENTION

Figure 1:
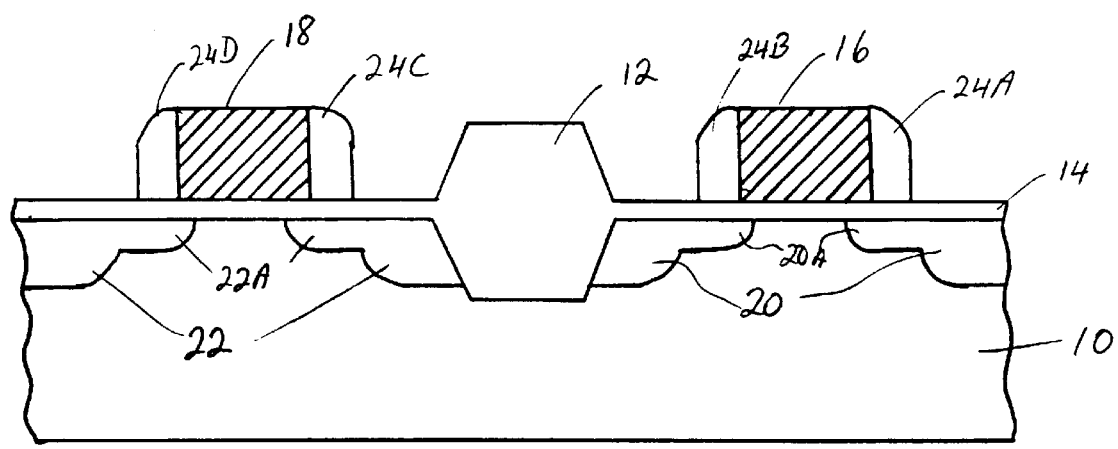
FIG. 1 is a cross-sectional view schematically illustrates a conventional CMOS semiconductor device.

Conventional methodologies for manufacturing MOS semiconductor devices employ particular materials for the gate electrode and an underlying dielectric layer. The choice of materials is limited to those capable of withstanding a variety of processing conditions while maintaining their integrity and the integrity of adjacent layers. The present invention advantageously exploits the high dielectric property of metal oxide materials to improve device performance by replacing the conventional gate oxide layer with a high dielectric material after formation of a precursor MOS device.

In a general aspect, the present invention is directed to a composite structure comprising a metal oxide layer between a gate electrode and a semiconductor substrate. A method of forming the structure comprises the step of applying a metalorganic material on the substrate and then pyrolyzing the applied metalorganic in an oxidizing atmosphere to form its corresponding metal oxide, as a layer on the substrate. During pyrolysis of the metalorganic, the organic moiety decomposes leaving the metal as an oxide.

Metalorganics are coordinate covalent compounds having a metal atom bound to an organic moiety via a bridging oxygen, sulfur, phosphorous, nitrogen, etc, such as a metal alkoxide, metal b-diketonate, metal dialkylamide, metal carboxylate. Many metal octoates, neodecanoates, amines, mercaptides are commercially available. Other metalorganic compounds can be prepared through conventional chemical preparations.

In an embodiment of the present invention, the metalorganic compound is selected from the group consisting of group IV, group V and group VII metalorganics. Example of such metalorganics include tantalum, titanium, zirconium or hafnium having organic ligands, such as methoxides, ethoxides, ethyl hexanoates, acetyl acetonates, butoxide, isomers and mixtures thereof, which are commercially available through, for example, Chemat, Tech, Inc., located in Northridge, Calif. The pyrolysis of the above mentioned metalorganics in an oxidizing atmosphere yield a group IV, group V and/or a group VIII metal oxide, such as hafnium, titanium, tantalum, zirconium and lead oxides.

In an embodiment of the present invention, the metalorganic material is applied by chemical solution deposition. Chemical solution deposition refers to all solution-based chemical processing techniques for the synthesis of metal oxide films. Chemical solution deposition is especially amenable for depositing metalorganic materials as thin films or thin residues within small-geometry openings in an integrated circuit. With the high wetability exhibited by employing chemical solutions, the bottom and corners of small-geometry openings are substantially if not completely covered with a metalorganic leaving vertical geometries unaffected.

The solubility, viscosity and volatility of a metalorganic and its solution depends on the metal atom, the length and structure of the organic moiety bound to the metal atom and the solvent system, which includes the solvent and/or any additives, such as surfactants, adhesion promoters, etc. Typical solvents include organic solvents, such as xylene, toluene, tetrahydrofuran, etc. In an embodiment of the present invention, a metalorganic solution comprises a hafnium IV t-butoxide metalorganic dissolved in xylene.

In practicing the present invention a solution or dispersion of a metalorganic compound is applied to the exposed substrate to cover the exposed surface. After application of the metalorganic solution a residue or thin film remains, the thin film is then pyrolized under such conditions that the organic moiety is substantially oxidize for easy removal of any organic residue. The choice of operating parameters will be governed by the metalorganic and carrier system. For example, the applied metalorganic and substrate can be subjected to a two step annealing process. The first step employs subjecting the metalorganic and substrate to a low temperature annealing process, e.g. about 300° C. to about 400° C., in air, oxygen, nitrogen, or any other oxidizing ambient. The second step employs subjecting the metalorganic and substrate to a high temperature process, e.g. about 600° C. to about 900° C., or a rapid thermal annealing step of up to 900° C. for a time sufficient to pyrolize the metalorganic to its corresponding metal oxide.

Figure 2:
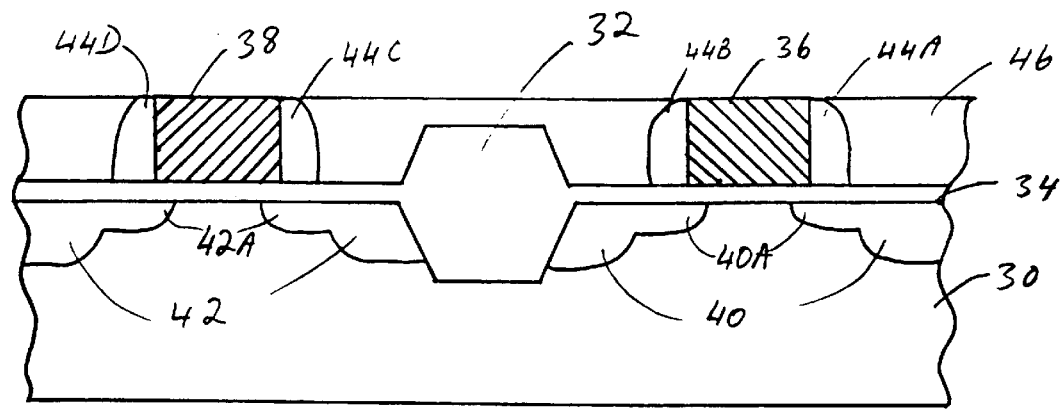
FIGS. 2–6 are cross-sectional views depicting sequential phases of forming a MOS device in accordance with an embodiment of the present invention.

Embodiments of the present invention are illustrated in FIGS. 2–6, which illustrate sequential views in the forming a damascene gate structure. As illustrated in FIG. 2, a field oxide area 32 is formed in a semiconductor substrate 30, as by STI or LOCOS. As used throughout the present disclosure and claims, the term "substrate" includes a semiconductor substrate or an epitaxial layer formed on the semiconductor substrate. A sacrificial gate oxide layer 34 is formed, as by thermal oxidation, on the surface of substrate 30, followed by formation of sacrificial gate electrodes 36 and 38, such as by deposition of a polysilicon layer, masking of the polysilicon layer, and etching. Gate electrodes 36 and 38 are typically formed at a thickness of about 1,000 Å to about 2,000 Å. Gate 36 will be associated with source/drain regions formed by implantation of n-type impurities, and gate; 38 will be associated with source/drain regions formed by implantation of p-type impurities.

N-type impurities NLDD, such as arsenic, phosphorus and/or other materials used to enhance transistor characteristics, are then implanted, as boy ion implantation, in substrate 30 to form n-type lightly or moderately doped source/drain extension implants, which form n-type stepped source/drain implants 40A in conjunction with n-type moderate or heavy source/drain implants 40. Likewise, P-type impurities PLDD, such as boron and/or other materials used to enhance transistor characteristics, are then implanted, as by ion implantation, in substrate 30 to form p-type lightly or moderately doped source/drain extension implants 42A which form p-type stepped source/drain implants in conjunction with p-type moderate or heavy source/drain implants 42.

A layer of an insulating material, such as silicon dioxide or silicon nitride, is then deposited, as by LPCVD or thermally grown, and then anisotropically etched to form sidewall spacers 44A–44D on the side surfaces of gate electrodes 36 and 38. After the etching procedure, sidewall spacers 44A–44D preferably extend from the gate electrodes from about 75 Å to about 300 Å.

N-type impurities NS/D, such as arsenic, phosphorus and/or other materials used to enhance transistor characteristics, are then implanted, as by ion implantation, in substrate 30 to form n-type moderate or heavy source/drain implants 40. Likewise, P-type impurities PS/D, such as boron and/or other materials used to enhance transistor characteristics are also, as by ion implantation, in substrate 30 to form p-type moderate or heavy source drain implants 42.

As in conventional MOS processing, impurities NLDD and PLDD are implanted at a dosage about 1–2 orders of magnitude lower than that of impurities NS/D and PS/D, and at a substantially lower energy; e.g., less than about 10 keV versus about 30 keV for NS/D and less than about 10 keV versus about 20 keV for PS/D.

Substrate 30 is then heated to diffuse and electrically activate implanted impurities NLDD, PLDD, NS/D and PS/D in stepped source/drain implants 40 and 42, as by rapid thermal annealing at a temperature of about 900° C. to about 1100° C. for less than about 30 seconds. Preferably, NS/D and NLDD implants are performed at a higher energy than the PS/D and PLDD implants, resulting in the n-type stepped source/drain implants 40 being deeper than p-type stepped source/drain implants 42 prior to the heating step. N-type impurities diffuse less quickly when heated than p-type impurities. Thus, by employing higher energy to form n-type stepped source/drain implants 40 deeper than p-type stepped source/drain implants 42, the depths of both n-type and p-type junctions are optimized after the heating step, resulting in improved device performance.

Insulating layer 46 is then deposited on the substrate to protect gate oxide layer 34, field oxide area 32 and sidewall spacers 44A–44D. Insulative layer 46 can be any material capable of protecting the underlying layers from subsequent etching processes. For example, insulative layer 46 can be a conformal layer comprising silicon nitride, silicon oxynitride, and/or silicon oxides or any low dielectric film such as FSG, HSQ, etc. The insulative layer can be deposited as by vacuum deposition techniques as, for example, low pressure chemical vapor deposition (LPCVD), plasma enhanced chemical vapor deposition (PEiCVD) or rapid thermal chemical vapor deposition (RTCVD) to a thickness above or below or at the upper surface of gate electrodes 36 and 38.

In an embodiment of the present invention, insulating layer 46 is deposited above the upper surface of gate electrodes 36 and 38 and subsequently planarized to expose the upper surfaces of them gate electrodes 36 and 38, resulting in the structure show in FIG. 2. Insulating layer 46 can be planarized employing plasma etching or by chemical mechanical polishing (CMP). Polishing is complete when insulative layer 46 is level with the upper surface of gate electrodes 36 and 38. When employing CMP, complete polishing can be realized by monitoring for an increase resistance which is encountered in performing the polishing action on the relatively harder gate electrodes in comparison to the relatively softer insulative layer 46. Alternatively, polishing can be continue beyond the original thickness of gate electrodes 36 and 38 to achieve a reduced thickness for the gate electrodes. In an embodiment of the present invention, insulating layer 46 and gate electrodes 36 and 38 are planarized to a thickness of no greater than about 2,000 Å, e.g. to a thickness from about 1,800 Å to about 800 Å.

Figure 3:
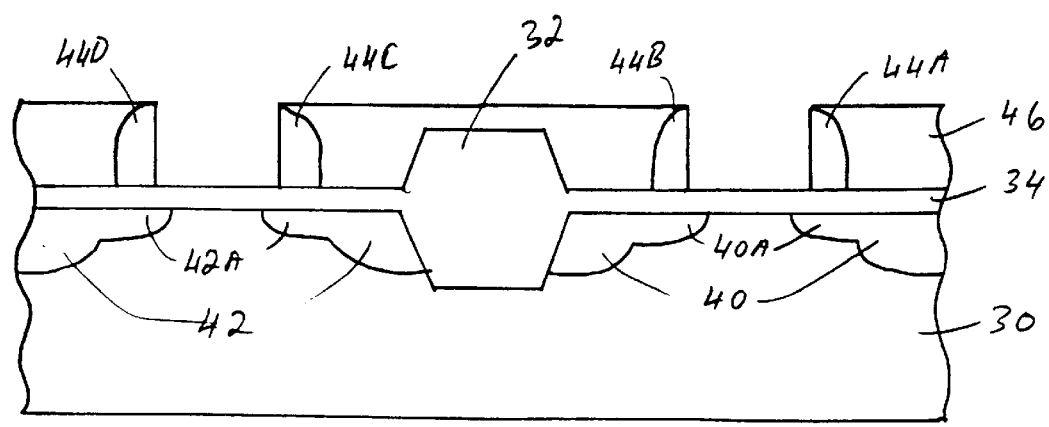

After depositing and optionally planarizing insulating layer 46, gate electrodes 36 and 38 are removed, as show in FIG. 3. In accordance with the present invention, gate electrodes 36 and 38 can be selectively removed by reactive ion etching, plasma etching, or wet etching. The choice of etching and etching parameters are selected so that the etchant is highly selective to gate electrodes 36 and 38.

Once the original gate electrodes have been removed, the sacrificial gate oxide is removed. In an embodiment of the present invention, the gate oxide layer can be removed by techniques selected for the removal of oxide materials. For example, gate oxide layer 34 can be removed by wet or plasma oxide etching, e.g., by employing hydrofluoric acid or a $CF_4$ plasma, respectively. After removal of exposed gate oxide layer 34, a second dielectric material can be formed on the exposed surface of the semiconductor substrate.

In practicing the present invention, a metalorganic solution is deposited on the exposed surface of the substrate. The metatorganic solution can be deposited by employing an atomized spraying unit or a liquid coating unit, as is kcnown to one of ordinary skill in the art of integrated circuit fabrication.

Figure 4:
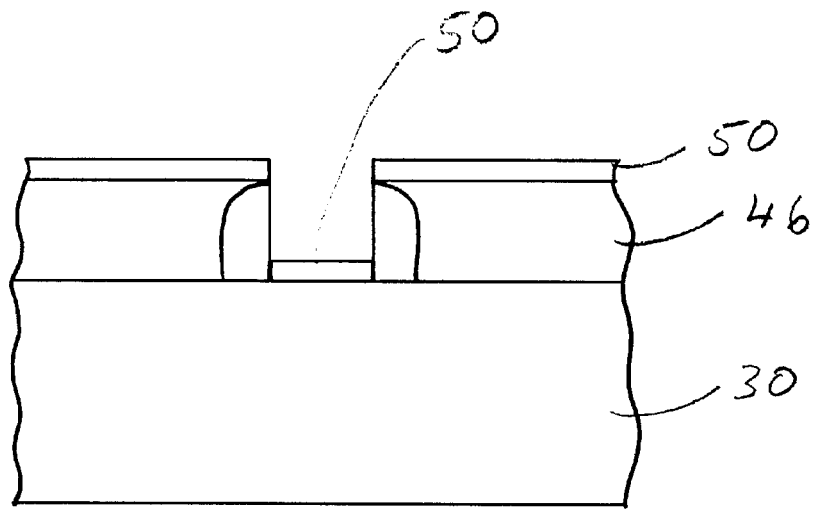

In an embodiment of the present invention, a titanium, zirconium or hafnium metalorganic, such as hafnium t-butoxide is dissolved in xylene or toluene or mixtures thereof and spin coated on to the substrate at speeds of several hundred or thousand rotations per minute (RPM) for improved uniformity of application of the metalorganic compound resulting in thin film 50 of the applied metalorganic on substrate 30 and on insulating layer 46, as shown in FIG. 4.

The viscosity and wetability of the metalorganic solution is such that little if any of the solution adheres to sidewalls 44A–D, i.e. there is substantially little or no measurable amount of metatorganic residue on the sidewalls or any other available vertical geometries present in or on the substrate.

After application of the metalorganic solution to the substrate, the substrate is subjected to heating in an oxidizing environment, such as air, oxygen, nitrogen, or mixture thereof, to pyrolize the metalorganic to remove the organic moiety and further or concomitantly heated to oxidize the metal (e.g. to oxidize a hafnium t-butoxide metalorganic to its hafnium oxide). In an embodiment of the present invention, the substrate is placed in an oven and heated at a temperature of about 300° C. to: about 900° C. The present invention, thus, enables the formation of a high dielectric, metal oxide layer as a replacement for a gate oxide with minimal dielectric material formed on the sidewall spacers of a MOS device.

In an embodiment of the present invention, a high dielectric lead-zirconium-titanium oxide is formed by applying a solution containing, one part lead 2-ethylhexanoate, 0.47 parts titanium dimethoxy dineodecanoate and 0.53 parts zirconium neodecanoate, relative to each other, in a few squirts of xylene. The solution is then spin coated on to the substrate and the substrate placed in an oven and filled with nitrogen gas. Heating the substrate in the oven over time causes a layer of metal oxide to form. For example, heating the substrate to about 380 C. for about 10 minutes followed by a second annealing to about 600 C. for about one hour causes the formation of the high dielectric lead-zirconium-titanium oxide to form. Due to the high wetability of chemical solutions, the metalorganic solution substantially if not completely covers the bottom and corners of openings in small-geometry integrated circuits having relatively high aspect ratio (defined as the depth over the width of an opening). Moreover, using chemical solutions, thinner conductive layers are controllably deposited.

In completing the MOS device, a second gate electrode can be formed on the metal oxide layer by depositing a conductive layer comprising a metal, such as aluminum, copper, titanium, tungsten, silver, gold, or alloys thereof. The conductive layer can also comprise polysilicon or silicides of the above-mentioned metals with silicon.

A second gate electrode can be formed by deposited a conformnal film comprising a conductive material over the structure. The conductive layer can be deposited by vacuum deposition techniques to completely fill the void resulting from the removal of the first gate electrode. Thereafter, the conductive layer can be etched employing photolithographic and etching techniques or polished, as by chemical mechanical polishing (CMP) to form the second gate electrode.

Figure 5:
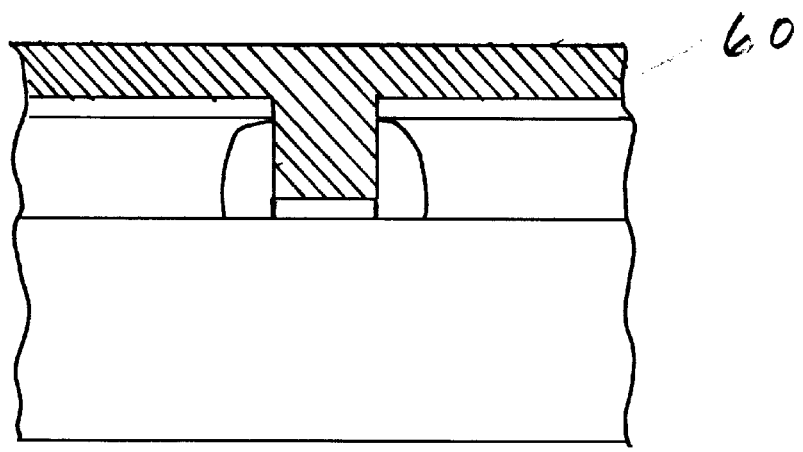
Figure 6:
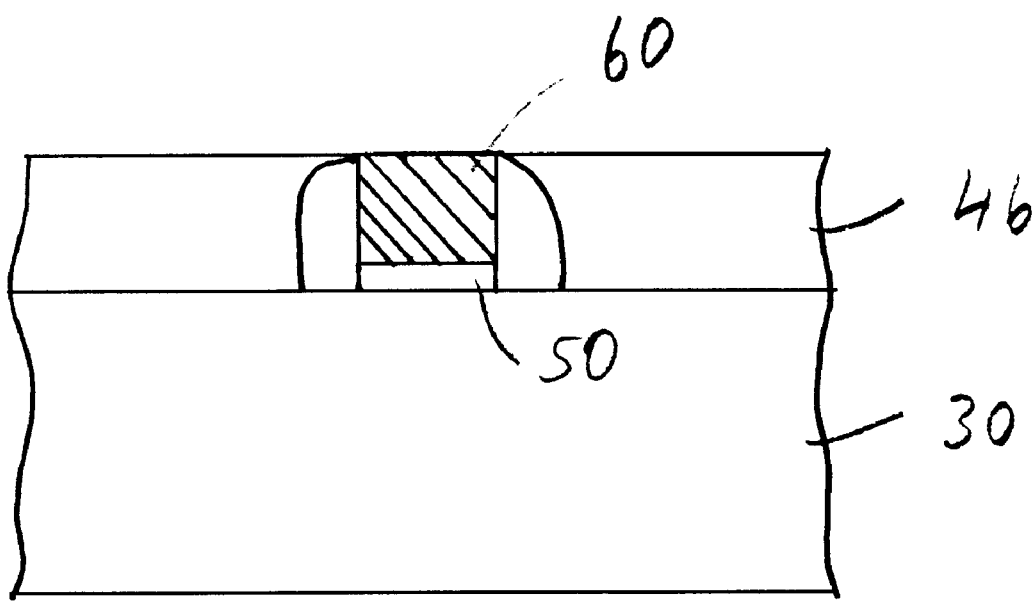

In the embodiment shown in FIG. 5, conductive film 60 is formed overlying metal oxide layer 50 and insulating layer 46 and completely fills the void resulting from the removal of the first gate electrode. The conductive layer can be polished back to underlying insulating layer 46 removing them metal oxide layer on insulating layer 46, thereby electrically isolating the gate electrodes, as shown int FIG. 6. The CMP process can be continued to reduce the new conductive gate and insulating layer as necessary to optimize integration of further steps such as contact layer etching, stress management, or other material/device properties. In accordance with the present invention, the second gate electrode can be formed by planarizing conductive film 60, as by chemical mechanical polishing. In an embodiment of the present invention, second gate electrode has a thickness of from about 1,500 Å to about 400 Å.

Additional process steps, such as the formation of metal contacts to electrically connect gate electrodes, formation of insulative layers to isolate the various features, and formation of inter-level metallization, complete and integrate the device.

The present invention is applicable to the manufacture of various types of semiconductor devices, particularly high density semiconductor devices having a design rule of about 0.18 $\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of forming a composite structure, which method comprises:

forming a sacrificial gate oxide layer on a surface of a semiconductor substrate;

forming a sacrificial gate electrode on the sacrificial gate oxide layer;

depositing an insulating layer over the substrate and adjacent to the sacrificial gate electrode;

removing the sacrificial gate electrode;

removing the sacrificial gate oxide layer to expose the surface of the substrate;

applying a metalorganic compound on the surface of the substrate; and forming a metal oxide layer on the surface of the substrate from the applied metatorganic compound.

2. The method according to claim 1, comprising applying the metalorganic compound by spin coating.

3. The method according to claim 1, wherein the metal oxide layer is selected from the group consisting of group IV, group V and group VIII metal oxides.

4. The method according to claim 1, comprising forming the metal oxide layer on the exposed surface of substrate by pyrolizing the metalorganic compound in a nitrogen ambience.

5. The method according to claim 1, comprising forming the metal oxide layer on the exposed surface of substrate by pyrolizing the metalorganic compound in a nitrogen ambience at a temperature of about 300° C. to about 900° C.

6. The method according to claim 1, comprising applying a metalorganic selected from the group consisting of a metal alkoxide, metal b-diketonate, metal dialkylamide and a metal carboxylate.

7. The method according to claim 1, comprising applying a tantalum, titanium, zirconium or hafnium ethoxide, ethyl hexanoate, acetyl acetonate, t-butoxide as the metalorganic compound.

8. The method according to claim 1, comprising forming the metal oxide layer on the exposed surface of substrate by spin coating a solution containing a hafnium metalorganic and pyrolizing the metalorganic compound in a nitrogen ambience at a temperature of about 300 C. to about 900 C.

9. A method of forming a semiconductor device, the method comprising:

forming a sacrificial gate oxide layer on a semiconductor substrate;

forming a first gate electrode on the sacrificial gate oxide layer;

depositing an insulating on the substrate and adjacent to the first gate electrode;

removing the first gate electrode;

removing the sacrificial gate oxide layer to expose the substrate thereunder;

forming a metal oxide layer on the exposed surface of the semiconductor substrate by depositing a metalorganic solution and pyrolizing the metalorganic solution; and forming a second gate electrode on the metal oxide layer.

10. The method of claim 9, comprising depositing a conductive layer on the metal oxide layer and polishing the conductive layer back to the insulating layer.

11. The method of claim 9, comprising applying the metalorganic compound by spin coating a solution of the metalorganic compound in a solvent.

12. The method of claim 11, comprising pyrolizing the metalorganic compound in an oxidizing ambient.

13. The method of claim 11, comprising pyrolizing the metalorganic compound at a temperature of about 300° C. to about 900° C.

* * * * *